United States Patent
Yoo et al.

(10) Patent No.: US 8,461,683 B2
(45) Date of Patent: Jun. 11, 2013

(54) SELF-FORMING, SELF-ALIGNED BARRIERS FOR BACK-END INTERCONNECTS AND METHODS OF MAKING SAME

(75) Inventors: Hui Jae Yoo, Hillsboro, OR (US); Jeffery D. Bielefeld, Forest Grove, OR (US); Sean W. King, Beaverton, OR (US); Sridhar Balakrishnan, Rio Rancho, NM (US)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 13/078,683

(22) Filed: Apr. 1, 2011

(65) Prior Publication Data
US 2012/0248608 A1    Oct. 4, 2012

(51) Int. Cl.
*H01L 23/52*        (2006.01)
*H01L 23/48*        (2006.01)
*H01L 29/40*        (2006.01)
*H01L 23/485*       (2006.01)

(52) U.S. Cl.
CPC ........... *H01L 23/485* (2013.01); *Y10S 438/927* (2013.01)
USPC ................... 257/751; 257/E29.157; 257/758; 257/774; 438/627; 438/643; 438/653; 438/927

(58) Field of Classification Search
CPC ............................ H01L 23/485; H01L 21/768
USPC .................. 257/E23.145, E23.011, 750, 751, 257/758–760, 774, E21.021, E21.584, E29.157; 438/618–627, 643, 653, 927
See application file for complete search history.

(56) References Cited

U.S. PATENT DOCUMENTS

| | | | |
|---|---|---|---|
| 5,824,599 A * | 10/1998 | Schacham-Diamand et al. | 438/678 |
| 5,930,669 A * | 7/1999 | Uzoh | 438/627 |
| 6,140,231 A * | 10/2000 | Lin et al. | 438/653 |
| 6,268,289 B1 * | 7/2001 | Chowdhury et al. | 438/687 |
| 6,433,429 B1 * | 8/2002 | Stamper | 257/751 |
| 6,436,825 B1 * | 8/2002 | Shue | 438/687 |
| 6,452,251 B1 * | 9/2002 | Bernstein et al. | 257/532 |
| 6,525,425 B1 * | 2/2003 | Woo et al. | 257/758 |
| 6,660,634 B1 * | 12/2003 | Ngo et al. | 438/687 |
| 6,787,480 B2 * | 9/2004 | Aoki et al. | 438/775 |
| 6,838,772 B2 * | 1/2005 | Saitoh et al. | 257/758 |
| 6,841,473 B1 * | 1/2005 | Wang et al. | 438/661 |

(Continued)

FOREIGN PATENT DOCUMENTS

KR    10-2007-0045986        5/2007

OTHER PUBLICATIONS

International Search Report and Written Opinion mailed Aug. 29, 2012 from International Application No. PCT/US2011/066922.

*Primary Examiner* — Chris Chu
(74) *Attorney, Agent, or Firm* — Schwabe, Williamson & Wyatt, P.C.

(57) ABSTRACT

Processes of forming an insulated wire into an interlayer dielectric layer (ILD) of a back-end metallization includes thermally treating a metallic barrier precursor under conditions to cause at least one alloying element in the barrier precursor to form a dielectric barrier between the wire and the ILD. The dielectric barrier is therefore a self-forming, self-aligned barrier. Thermal processing is done under conditions to cause the at least one alloying element to migrate from a zone of higher concentration thereof to a zone of lower concentration thereof to further form the dielectric barrier. Various apparatus are made by the process.

17 Claims, 9 Drawing Sheets

U.S. PATENT DOCUMENTS

| | | |
|---|---|---|
| 7,163,883 B2 * | 1/2007 | Agarwala et al. .............. 438/598 |
| 7,176,571 B2 * | 2/2007 | Cheng et al. ................... 257/750 |
| 7,211,508 B2 * | 5/2007 | Chung et al. ................... 438/633 |
| 7,498,254 B2 * | 3/2009 | Yang et al. ..................... 438/618 |
| 7,514,353 B2 * | 4/2009 | Weidman et al. .............. 438/627 |
| 7,576,006 B1 * | 8/2009 | Yu et al. ......................... 438/687 |
| 7,663,239 B2 * | 2/2010 | Ikeda et al. .................... 257/751 |
| 7,694,413 B2 * | 4/2010 | Johnston et al. ................ 29/825 |
| 7,704,873 B1 * | 4/2010 | Yu et al. ......................... 438/622 |
| 7,709,965 B2 * | 5/2010 | Kim ............................... 257/774 |
| 8,017,519 B2 * | 9/2011 | Ishikawa ........................ 438/655 |
| 8,105,935 B2 * | 1/2012 | Ohara et al. ................... 438/618 |
| 2004/0266171 A1 * | 12/2004 | Aoki et al. ..................... 438/622 |
| 2006/0211235 A1 * | 9/2006 | Usami ............................ 438/618 |
| 2008/0054466 A1 * | 3/2008 | Nasu et al. ..................... 257/751 |
| 2008/0132064 A1 | 6/2008 | Streck et al. |
| 2009/0014877 A1 | 1/2009 | Chang et al. |
| 2009/0017621 A1 * | 1/2009 | Sako et al. ..................... 438/674 |
| 2010/0181673 A1 * | 7/2010 | Hayashi et al. ................ 257/754 |
| 2010/0314768 A1 | 12/2010 | Darnon et al. |

* cited by examiner

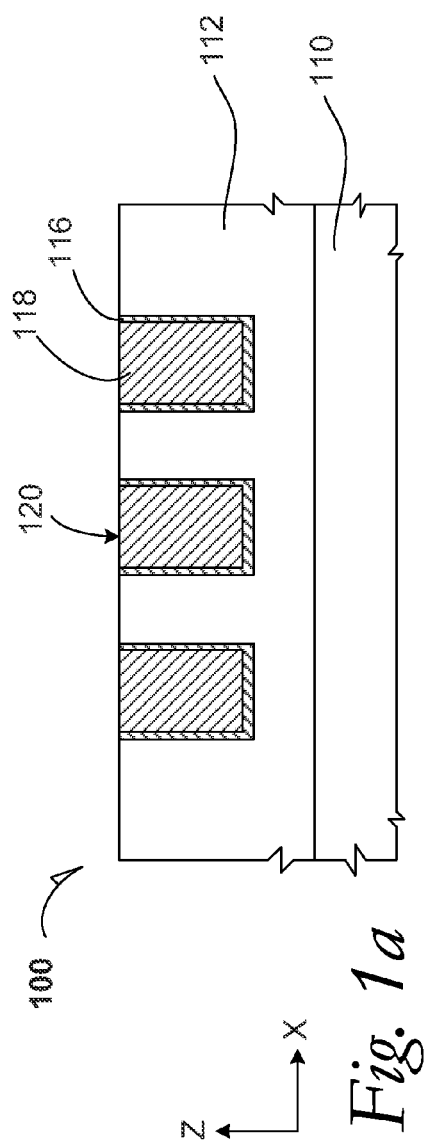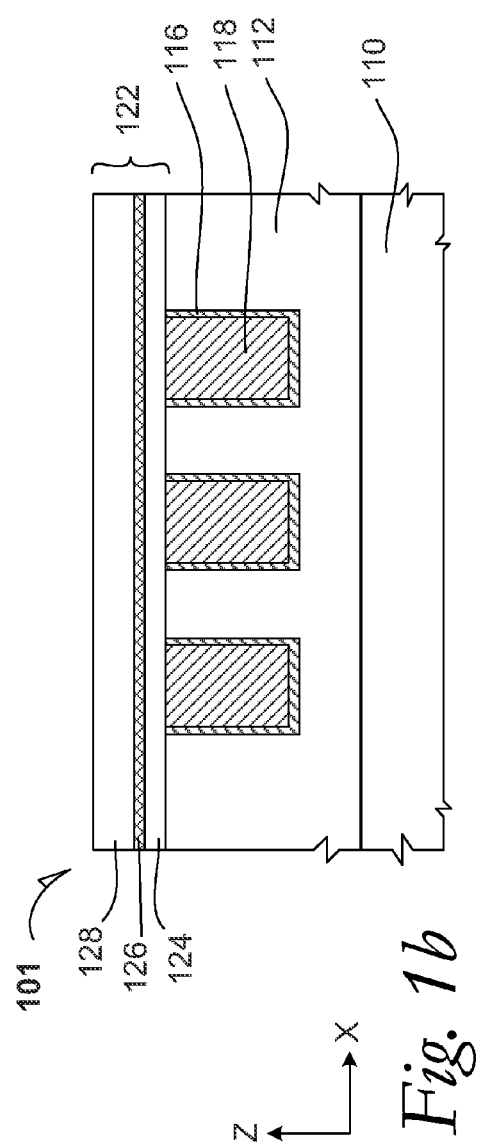

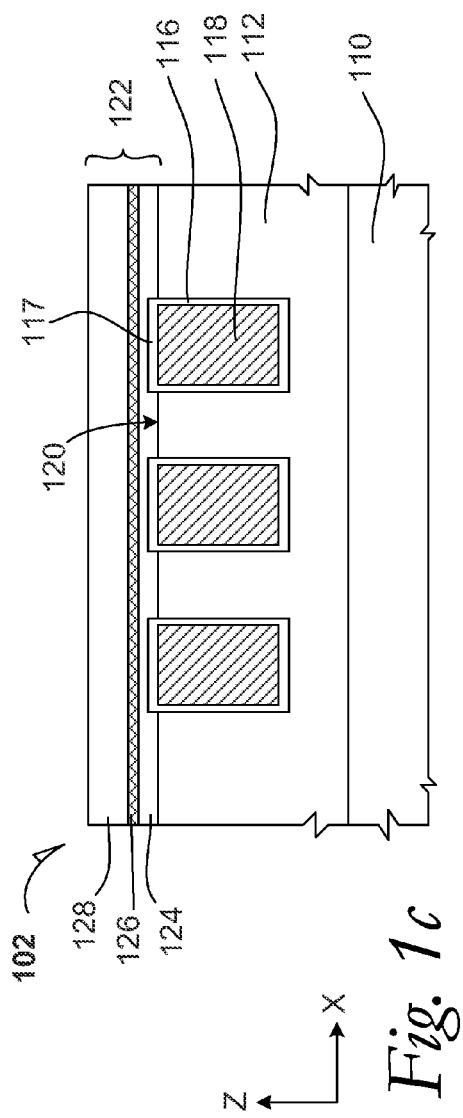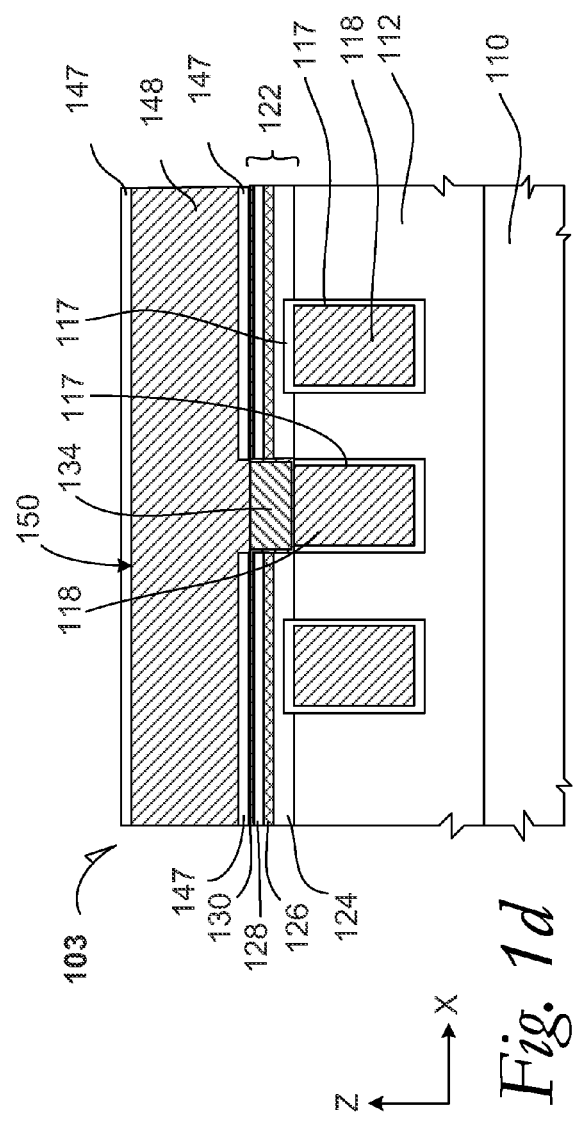

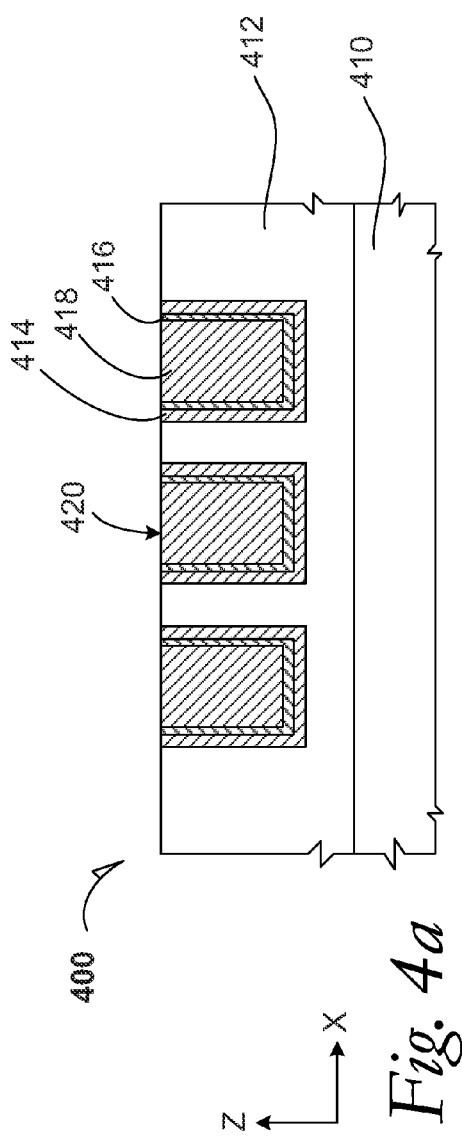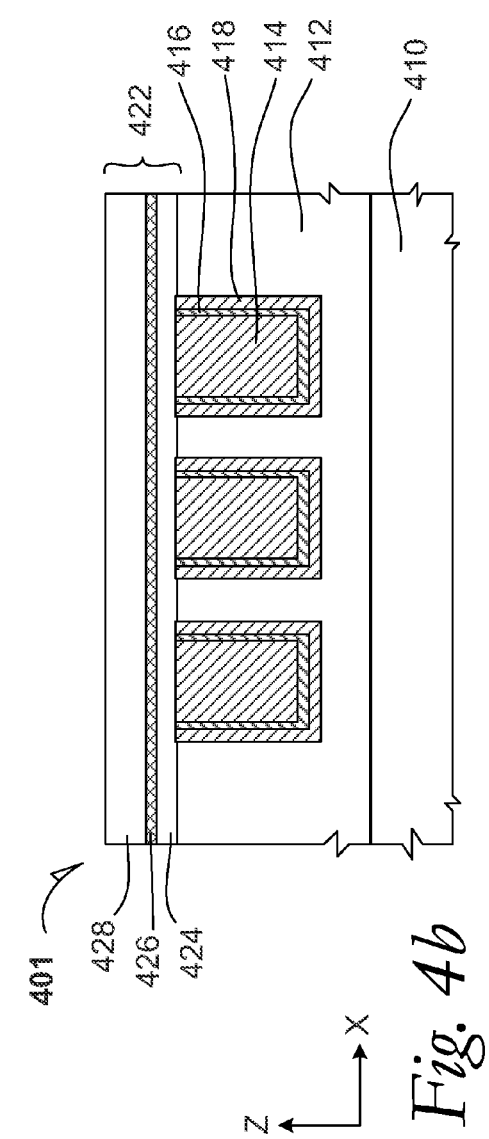

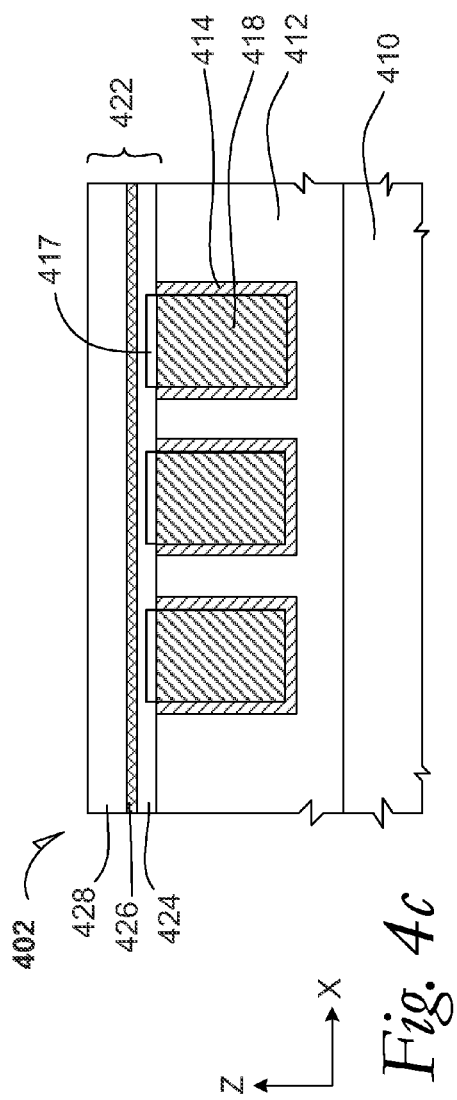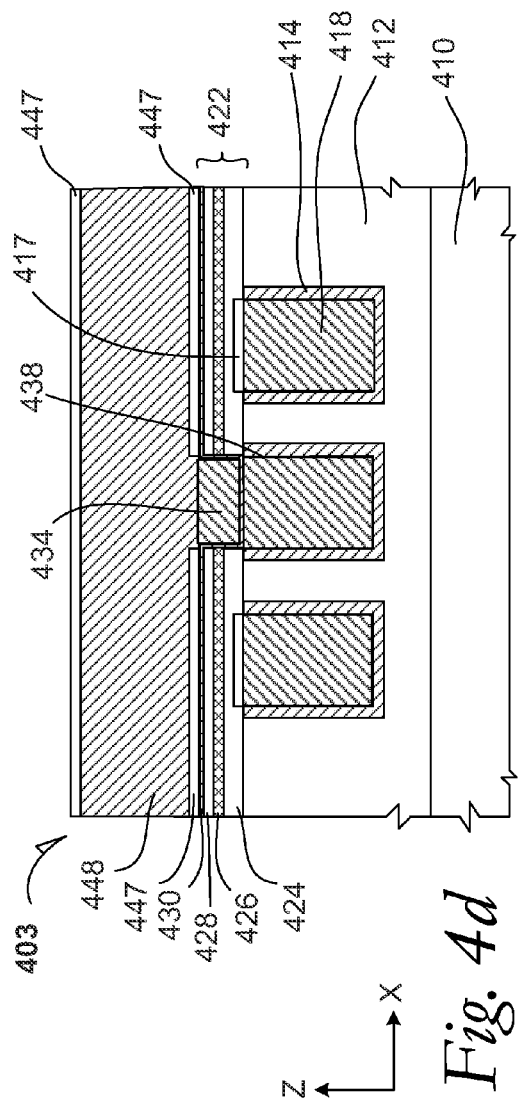

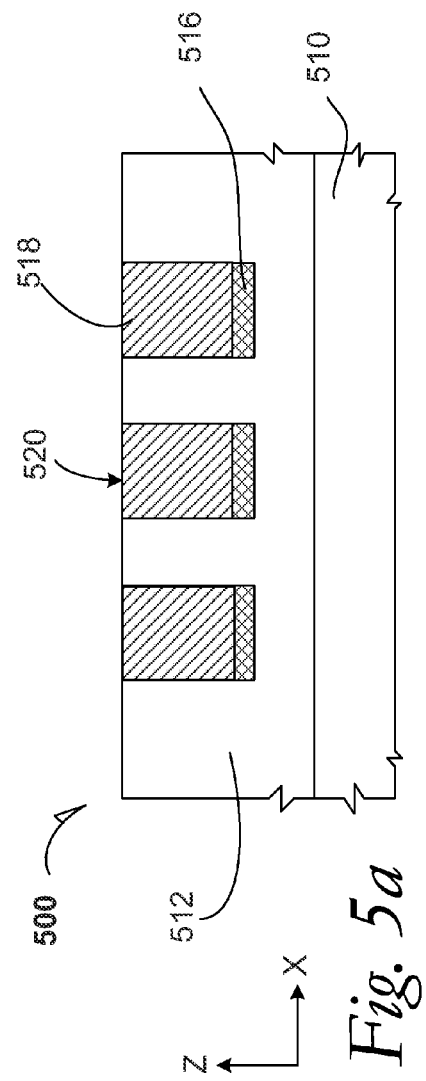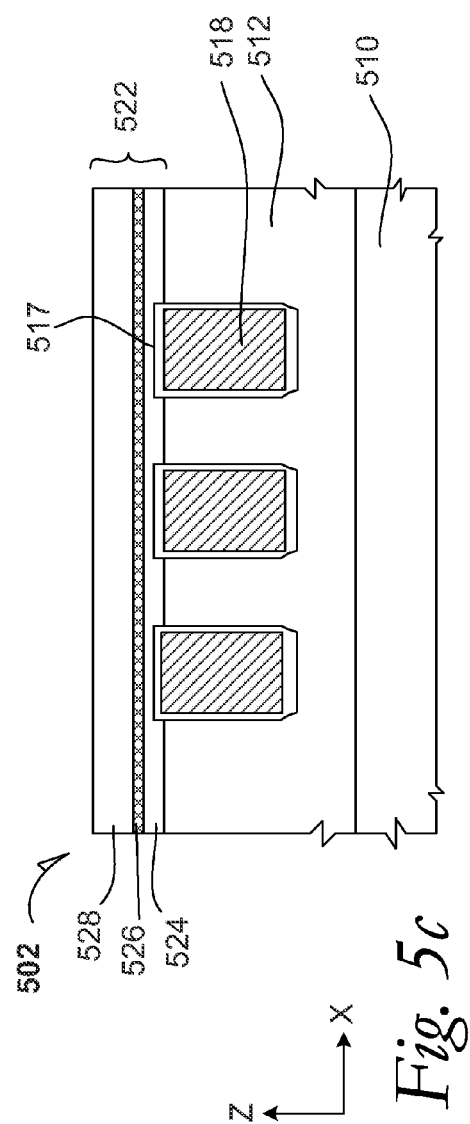

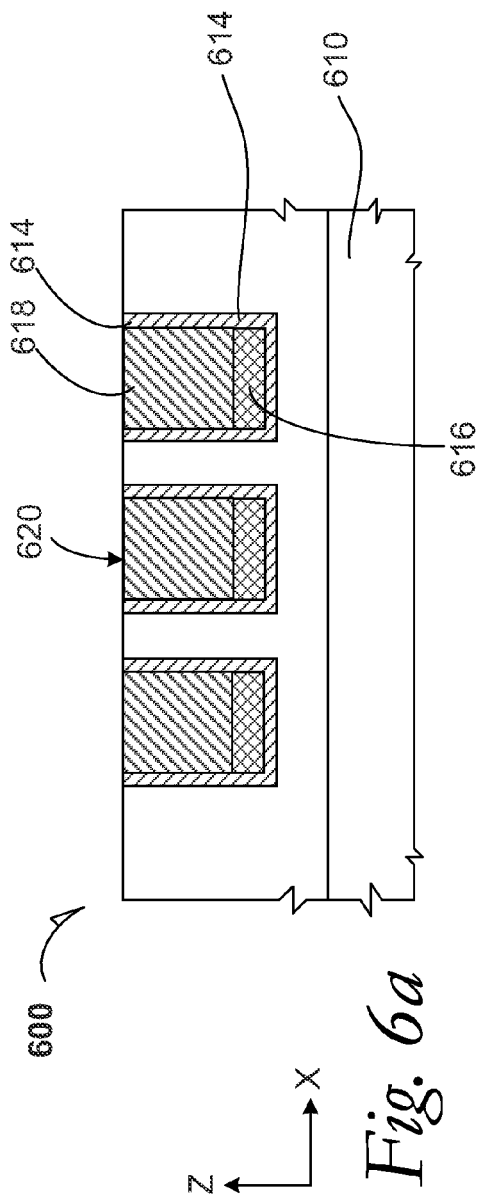
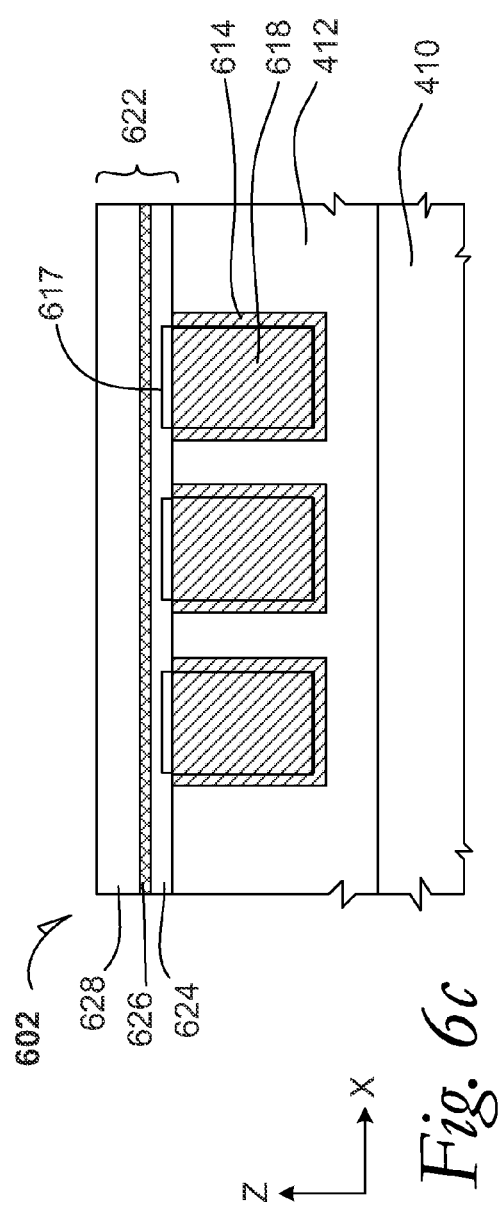

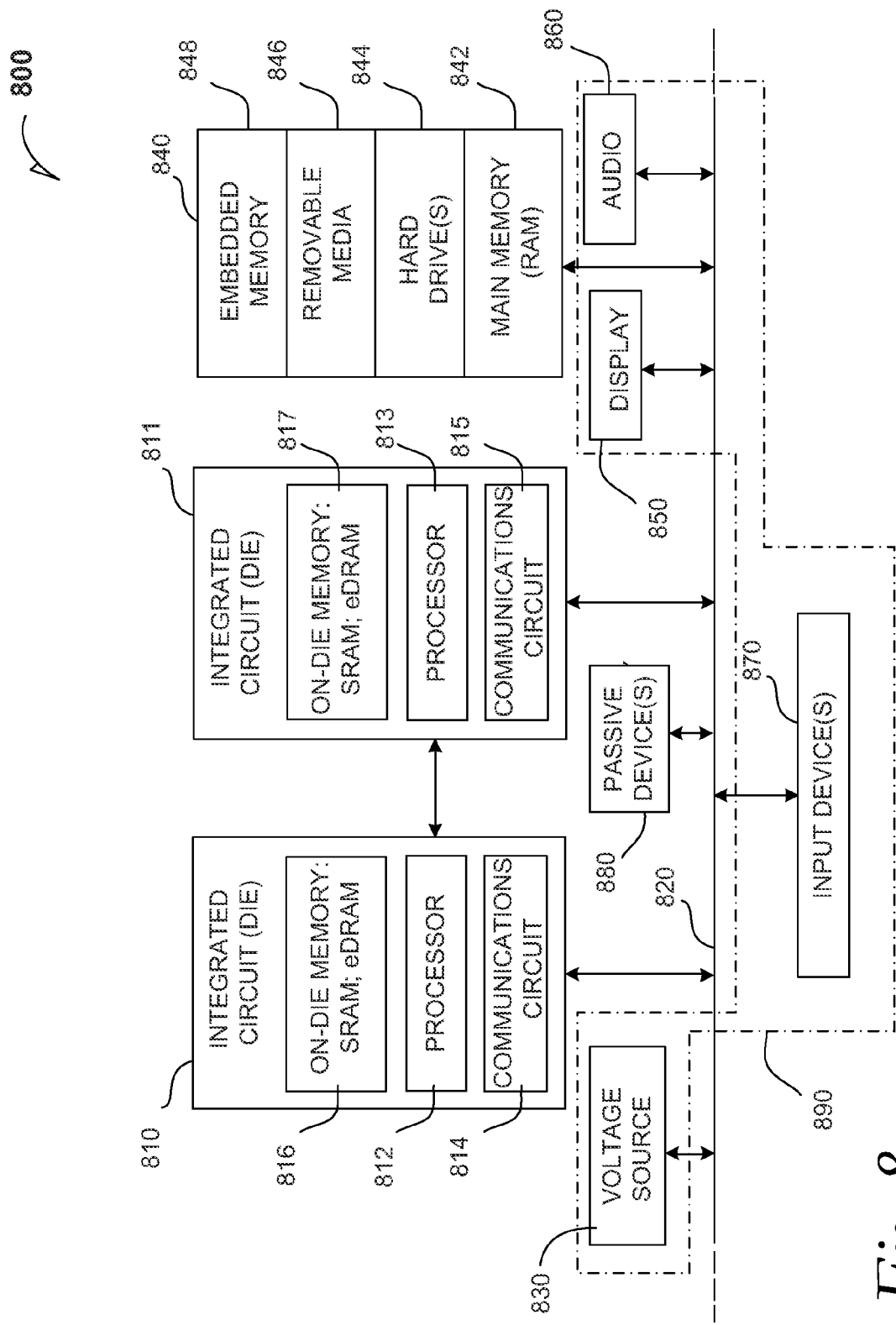

SELF-FORMING, SELF-ALIGNED BARRIERS FOR BACK-END INTERCONNECTS AND METHODS OF MAKING SAME

Disclosed embodiments relate to barriers in back-end metallization and methods of forming them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1a is a cross-section elevation of a back-end metallization during processing according to an example embodiment;

FIG. 1b is a cross-section elevation of the back-end metallization depicted in FIG. 1a after further processing according to an embodiment;

FIG. 1c is a cross-section elevation of the back-end metallization depicted in FIG. 1b after further processing according to an embodiment;

FIG. 1d is a cross-section elevation of the back-end metallization depicted in FIG. 1c after further processing according to an embodiment;

FIG. 4a is a cross-section elevation of a back-end metallization during processing according to an example embodiment;

FIG. 4b is a cross-section elevation of a back-end metallization depicted in FIG. 4a after further processing according to an embodiment;

FIG. 4c is a cross-section elevation of a back-end metallization depicted in FIG. 4b after further processing according to an embodiment;

FIG. 4d is a cross-section elevation of a back-end metallization depicted in FIG. 4c after further processing according to an embodiment;

FIG. 5a is a cross-section elevation of a back-end metallization during processing according to an example embodiment;

FIG. 5c is a cross-section elevation of a back-end metallization depicted in FIG. 5a after further processing according to an embodiment;

FIG. 6a is a cross-section elevation of a back-end metallization during processing according to an example embodiment;

FIG. 6c is a cross-section elevation of a back-end metallization depicted in FIG. 6a after further processing according to an embodiment;

FIG. 8 is a schematic of a computer system according to an embodiment.

DETAILED DESCRIPTION

Figure 2:
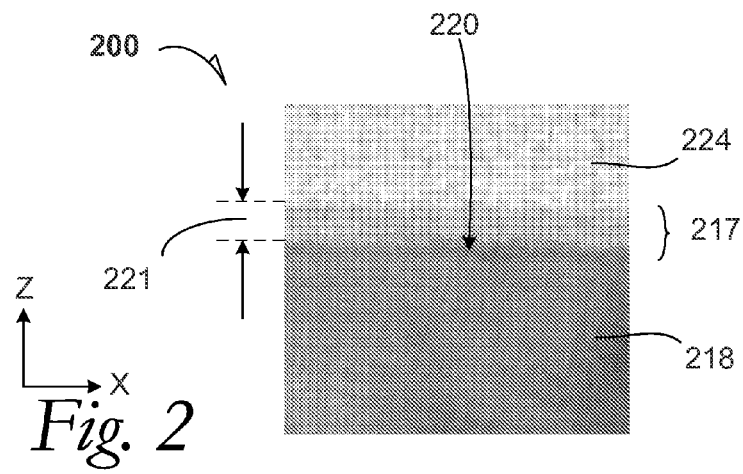
FIG. 2 is a computer recreation of a photo micrograph detail of a back-end metallization according to an example embodiment.

Processes are disclosed where back-end metallizations are fabricated by self-forming, self-aligned (SSA) barriers to encapsulate the metallization. Where front-end processing may refer to formation of active and passive devices in semi conductive substrates, back-end metallization processing may refer to formation of metal traces and vias that allow a semi conductive microelectronic device to pin out to the outside world.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

FIG. 1a is a cross-section elevation of a back-end metallization 100 during processing according to an example embodiment. A semi conductive substrate 110 is provided. In an embodiment, the semi conductive substrate 110 includes active and passive circuitry in semi conductive material. For example, the semi conductive substrate 110 is part of a processor manufactured by Intel Corporation of Santa Clara, Calif. In an embodiment, the semi conductive substrate 110 contains a system-on-chip (SoC) 110 such as a dual-processor microelectronic device. In an embodiment, the semi conductive substrate 110 includes a digital processor and radio-frequency integrated circuit (DP-RFIC) hybrid device 110. In an embodiment, the semi conductive substrate 110 includes an SoC 110 that includes a DP and a graphics (DP-GIC) hybrid.

It may be appreciated that "silicon" may refer to any useful semi conductive material such as Si, GaAs, InSb, doped versions of the former, and others, although each may have non-equivalent behavior that is useful for given applications. For example, a semi conductive substrate 110 may exhibit a resistivity in a range from 0.1 milliohm-cm to 20 milliohm-cm and be any useful silicon. In an embodiment, 32 nanometer architecture design rules are used to fabricate the semi conductive substrate 110. In an embodiment, 22 nanometer architecture design rules are used to fabricate the semi conductive substrate 110.

During processing, a low dielectric constant (low-k) interlayer dielectric layer (ILD) 112 is formed on the semi conductive substrate 110. The dielectric layer may be considered low-k if the dielectric constant is lower than that of silica. In an embodiment, the low-k ILD 112 is a silicon-containing material such as having a formulation that follows $Si_xC_yO_zH_q$ where x, y, z, and q have amounts and ratios that are useful for a low-k ILD for back-end metallization applications The low-k ILD 112 contains a barrier precursor 116 and a back-end metallization which has the form factor of a wire 118 seen in cross section, but has a lengthy aspect ratio when seen in an X-Y depiction. The wire 118 is processed to form an insulated wire according to several embodiments. Processing includes patterning a mask upon the low-k ILD 112, etching recesses, and filling the recesses with a liner film such as with a copper alloy that is the barrier precursor 116. In an embodiment, the barrier precursor 116 is formed by physical vapor deposition (PVD). In an embodiment, the barrier precursor 116 is sputtered from an aluminum-copper target and the barrier precursor 116 forms an $Al_xCu_y$ alloy. In an embodiment, the $Al_xCu_y$ alloy is formulated to make a useful barrier precursor for a self-forming, self-aligned barrier. In an embodiment, the barrier precursor 116 is sputtered from a manganese-copper target and the barrier precursor 116 forms a $Mn_xCu_y$ alloy. In an embodiment, the $Mn_xCu_y$ alloy is formulated to make a useful barrier precursor for an SSA barrier. In an embodiment, the barrier precursor 116 is sputtered from a titanium-copper target and the barrier precursor 116 forms a $Ti_xCu_y$ alloy. In an embodiment, the $Ti_xCu_y$ alloy is formulated to make a useful barrier precursor for an SSA barrier. In an embodiment, the barrier precursor 116 is sputtered from a calcium-copper target and the barrier precursor 116 forms a $Ca_xCu_y$ alloy. In an embodiment, the $Ca_xCu_y$ alloy is formulated to make a useful barrier precursor for an SSA barrier. In an embodiment, the barrier precursor 116 is sputtered from a zirconium-copper target and the barrier precursor 116 forms a $Zr_xCu_y$ alloy. In an embodiment, the $Zr_xCu_y$ alloy is formulated to make a useful barrier precursor for an SSA barrier. In an embodiment, the barrier precursor 116 is sputtered from an aluminum-titanium-copper target and the barrier precursor 116 forms an $Al_xTi_yCu_z$ alloy. In an embodiment, the $Al_xTi_yCu_z$ alloy is formulated to make a useful barrier precursor for an SSA barrier. Where the wire 118 is copper or a copper alloy, other useful copper alloys may be used to form the barrier precursor 116.

After filling the wire 118 into the recesses that contain the barrier precursor 116, a top surface 120 may be formed such as by planarizing. In an embodiment, the top surface 120 is formed by mechanical planarizing. In an embodiment, the top surface 120 is formed by a chemical-planarizing etch. In an embodiment, the top surface 120 is formed by a chemical-mechanical-planarizing etch.

FIG. 1b is a cross-section elevation of the back-end metallization depicted in FIG. 1a after further processing according to an embodiment. The back-end metallization 101 has been processed by formation of a composite dielectric layer 122 upon the top surface 120 (FIG. 1a). In an embodiment, the composite dielectric layer 122 includes a first film 124 that is substantially the same chemistry as the low-k ILD 112 such a silicon-containing material such as having a formulation that follows $Si_xC_yO_zH_q$ where x, y, z, and q have amounts and ratios that are useful for a low-k ILD for back-end metallization applications. Other low-k ILD chemistries may be used depending upon a given application. Following formation of the first film 124, a second film 126 is formed that is denser than the first film 124. In an embodiment, the second film 126 is denser than the first film 124 by a factor in a range from 1.01 to 2.1 In an embodiment where the first film 124 is a silicon-containing material such as having a formulation that follows $Si_xC_yO_zH_q$, the second film 126 has a composition of $Si_xC_y$. In an embodiment, where the first film 124 has a thickness in a range from 12-18 nm, the second film 126 has a thickness in a range from 4-8 nm.

After forming the second film 126, a subsequent film 128 is formed above the denser second film 126. In an embodiment, the subsequent film 128 is the same material as the first film 124. In an embodiment, formation of each film in the composite dielectric 122 is done by chemical vapor deposition (CVD). In an embodiment, formation of each film in the composite dielectric 122 is done by spinning on a material and curing.

FIG. 1c is a cross-section elevation of the back-end metallization depicted in FIG. 1b after further processing according to an embodiment. The back-end metallization 102 has been processed by thermal treatment that converts the barrier precursor 116 (see FIG. 1b) into an SSA barrier 117 and thereby achieves an insulated wire 118. The self-formed, self-aligned barrier 117 is also an integral, continuous, and closed structure 117 as seen in the depicted X-Z cross section. Consequently, it may be understood that this is a cross-sectional view description where the meaning of "thermally treating causes the barrier precursor to form an integral, continuous, and closed structure that is self-formed and self-aligned around the wire". Thermal processing may be carried out by heating the apparatus 102 in a non-reactive atmosphere at a temperature range from 300° C. to 400° C. for a time period from 1 to 60 min As illustrated, the self-forming, self-aligned barrier 117 has grown from a U- or cup-shaped barrier precursor 116 (FIG. 1b) to become an enclosed barrier 117. The enclosed barrier 117 has grown onto the top surface 120 but only adjacent the wire 118. The enclosed barrier 117 has not grown significantly upon the low-k ILD 112 at the top surface 120. It is observed that the alloying element(s) in the barrier precursor 116 have been taken up by—and reacted with at least silicon and oxygen components in the ILD materials 112 and 124. Although no specific theory of formation is propounded, a migration-resistant husk may be formed within at least part of the enclosed barrier 117. Planar migration of alloying elements along the bottom, sides, and top of the wire 118 may occur by alloy-element disassociation out of the barrier precursor 116 where these alloy elements are in abundance to allow formation of the enclosed barrier 117. Planar migration of the alloy elements proceeds in the Z-direction along the wire 118 from the barrier precursor 116. Planar migration also proceeds in the X-direction (and the Y-direction which is into and out of the plane of the FIG.) along the wire 118 such that the enclosed barrier 117 has been formed. It is observed that the enclosed barrier 117 is a silicate that is richer in the alloy elements of the copper-alloy barrier precursor 116 and leaner in copper than the barrier precursor 116 before thermal processing.

In an embodiment, a copper-alloying-metal-containing complex barrier precursor 116 is formed such as an $Al_xCu_z$ alloy that is sputtered from an aluminum-copper target. During thermal processing although the enclosed barrier 117 begins to form a husk that resists diffusion of the barrier precursor alloy elements, the alloying metal remains mostly in place to form an SSA and a barrier liner layer where the SSA is an integral and enclosed barrier 117. Other complex barrier precursors may be sputtered such as a manganese-copper-metal. Other complex barrier precursors may be sputtered such as a cobalt-copper-metal. The alloying-metal-containing complex barrier precursor may be formulated as $Mm_xCu_z$ where Mm is the metal that tends to migrate.

FIG. 2 is a computer recreation of a photomicrograph detail 200 of a back-end metallization according to an example embodiment. A wire 218 of copper was filled into a recess that included a barrier precursor made of a copper-manganese alloy. A composite dielectric layer was formed over a top surface 220 that included both the top of the wire 218 and of a low-k ILD such as the low-k ILD 112 depicted in FIG. 1a and FIG. 1b. Thermal processing was done on the apparatus such that the barrier precursor formed a silicide from the alloy elements in the copper barrier precursor; in this case from manganese. The thermal processing also resulted in migration of alloy elements out of the barrier precursor. The migration was to the top surface 220 to also form a silicide adjacent an ILD layer 224. The silicide is seen as a portion of an enclosed barrier 217. In an embodiment, the enclosed barrier 217 had a thickness 221 in a range from 2 nm to 2.6 nm. In the illustrated embodiment, the thickness 221 of the enclosed barrier 217 as seen in the Z-direction was from 2.2 nm to 2.4 nm along the top surface 220.

It may be understood by virtue of the process embodiments that achieve the enclosed barrier 217, that a copper-lean composition of silicide in the barrier 217 is adjacent the ILD layer 224, and that a copper-rich composition of silicide in the barrier 217 is adjacent the wire 218. Due to the thin nature of the barrier 217, extensive thermal processing may cause the barrier 217 to form a substantially uniform dielectric with respect to chemical composition. In such an embodiment, a "copper-lean composition of silicide" means a silicide that interfaces with an ILD and virtually no copper can be found at the interface, and a "copper-rich composition of silicide" means a silicide that interfaces with a copper wire.

FIG. 1d is a cross-section elevation of a back-end metallization depicted in FIG. 1c after further processing according to an embodiment. The back-end metallization 103 is seen in larger context such as has been processed by thermal treatment that converts the barrier precursor 116 (see FIG. 1b) into an SSA barrier 117.

An additional metallization has been formed over the back-end metallization 118. In a process embodiment, an interconnect film 130 is formed such as by copper electroless plating. A recess is opened in the composite dielectric layer 122 that exposes the wire 118, and the interconnect film 130 is formed in preparation for another metallization layer.

In an embodiment, the metallization layers may range from metal-1 (M1) to M12 for example. Where the wire 118 is an $i^{th}$ metallization, the next metallization may be referred to as a subsequent wire $i+1^{st}$ metallization 148 in n metallization layers such as M2 to M12 according to an embodiment. During processing, a via 134 is formed through the composite dielectric layer 122. It may now be appreciated that the via 134 and the subsequent wire 118 may be formed simultaneously and integrally such as by a dual-damascene recess that is lined with the interconnect film 130.

An $i+1^{st}$ self-forming, self-aligned enclosed barrier 147 has also been formed in preparation for laying down the subsequent wire 148. Formation of the $i+1^{st}$ self-forming, self-aligned barrier 147 may also be done similarly to formation of the $i^{th}$ self-forming, self-aligned barrier 117. For example, a barrier precursor is formed similar to the barrier precursor 116 (see FIG. 1b). The barrier precursor is filled with the $i+1^{st}$ subsequent wire 148 and a composite dielectric layer similar to the composite dielectric layer 122 seen in FIG. 1b is formed on an $i+1^{st}$ top surface 150. Next, thermal processing is repeated such that the $i+1^{st}$ self-forming, self-aligned barrier 147 grows upon the top surface 150 but only on the wire 148.

It may now be appreciated that several metallization layers may be formed in this manner such that for example an M1-M12 metallization is achieved. In at least one of the metallization layers, an SSA barrier is formed according to an embodiment.

It may now also be appreciated that thermal budgets can be taken into consideration such that an entire metallization such as up to M12 is formed, but thermal processing is carried out only after all the metallizations have been installed. In this embodiment, the self-forming, self-aligned barriers of the several metallization layers are all formed simultaneously.

In an embodiment such as with multiple metallization layers being formed, a fraction of the metallization layers is formed followed by a first thermal processing. For example six metallization layers are formed (M1-M6) and first thermally processed, followed by six more metallizations (M7-M12) formed subsequently thermally processed. In an embodiment where the subsequent metallization is much thicker than the previous metallizations, SSA barriers may be formed upon the previous metallizations and no SSA barrier is formed upon the subsequent metallization. For example, a subsequent metallization may be thicker than all the previous metallizations put together (in the composite Z-direction), and thermal processing is done to form several SSA barriers in at least one of the previous metallizations, followed by forming the thicker subsequent metallization.

In an embodiment, the thermal budget is spent by thermally processing each metallization layer seriatim such that each self-forming, self-aligned barrier has been fully formed and alloy element migration is stopped. In an embodiment, the thermal budget is spent by thermally processing each metallization layer seriatim but each self-forming, self-aligned barrier is not fully thermally processed when it is the most recent self-forming, self-aligned barrier to be formed. In this way, the first self-forming, self-aligned barrier is fully thermally processed during thermal processing of a subsequent self-forming, self-aligned barrier.

Figure 3:
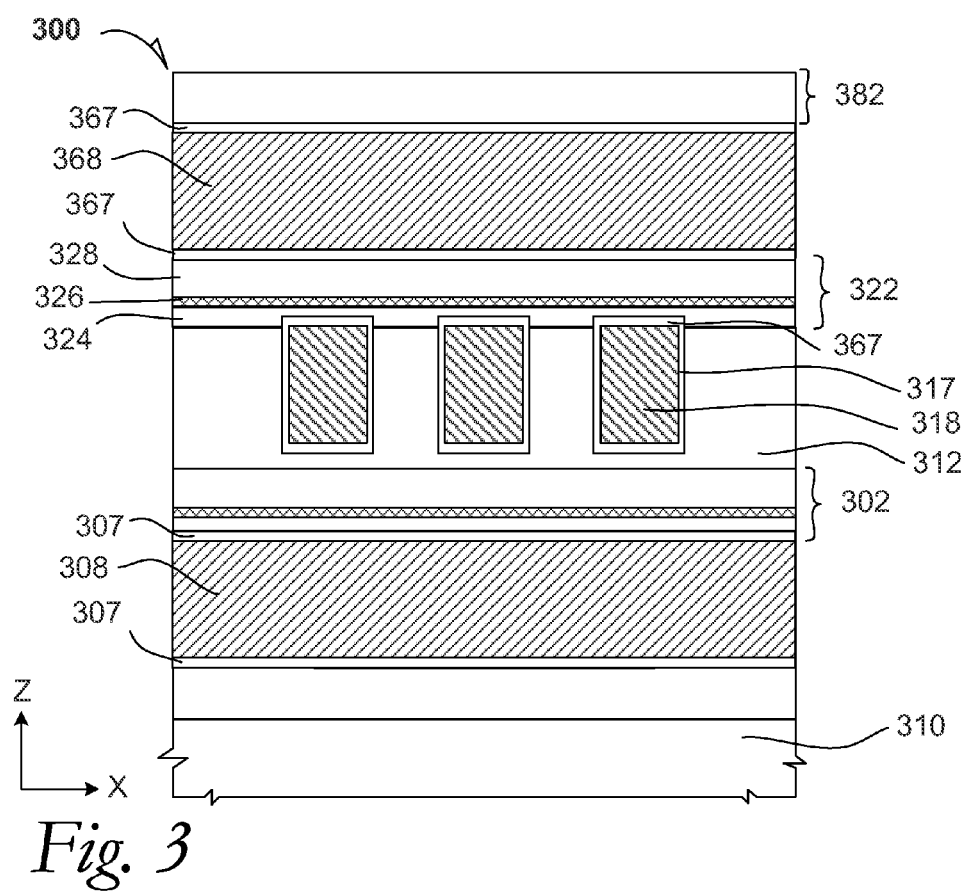
FIG. 3 is a cross-section elevation of a back-end metallization according to an example embodiment.

FIG. 3 is a cross-section elevation of a back-end metallization 300 according to an example embodiment. The back-end metallization 300 is depicted in a standard five-conductor configuration for evaluation of interconnect capacitance with n equal to three metallization layers or also as referred to as an M3 metallization. An $i^{th}$ metallization includes a wire 318 and an SSA barrier 317 according to an embodiment. Consequently, the wire 318 is an insulated wire 318. A previous $(i-1^{st})$ self-forming, self-aligned barrier 307 is shown to enclose a previous wire 308, and a subsequent $(i+1^{st})$ self-forming, self-aligned barrier 367 is shown to enclose a subsequent wire 368. It can also be seen that a composite dielectric 302 has been formed above the wire 308, as well as a composite dielectric 322 has been formed above the wire 318 according to an embodiment. Where the subsequent wire 368 is the last wire in the back-end metallization a top dielectric layer 382 is formed. Other terminology may be applied to the several wires such as a first wire 308, a second wire 318, and a subsequent wire 368. It may be appreciated that the metallizations are connected though various vias, but none are depicted in FIG. 3.

It may also be appreciated that the three metallization layers illustrated may be the top three metallizations in a metallization such as M10. In this embodiment, M10 is the subsequent wire, M9 is the wire 318, and M08 is the previous wire 308. Other metallization numbers may be included such as each from M3 as the subsequent metallization up to M12 as the subsequent metallization. Higher than M12 may also be achieved when useful in a given application.

By use of the process embodiments, a lower capacitance is achieved such as in the five-electrode model. For example where an etch-stop layer may be required above the wire 318, the process embodiments do not use an etch-stop layer and capacitance is lowered by about 10% for such a five-conductor model.

FIG. 4a is a cross-section elevation of a back-end metallization 400 during processing according to an example embodiment. A semi conductive substrate 410 is provided. In an embodiment, the semi conductive substrate 410 includes any semi conductive substrate embodiment depicted and described for the structures in FIGS. 1a, 1b, 1c, and 1d.

During processing, a low-k ILD 412 is formed on the semi conductive substrate 410. In an embodiment, the low-k ILD 412 is any embodiment depicted and described for the structure in FIGS. 1a, 1b, 1c, and 1d.

The low-k ILD 412 contains a barrier liner 414 and a barrier precursor 416, as well as a back-end metallization which has the form factor of a wire 418. Processing includes patterning a mask upon the low-k ILD 412, etching recesses, and filling the recesses with a barrier liner 414 as well as a liner film such as with a copper alloy that is the barrier precursor 416. In an embodiment the barrier liner 414 is a refractory metal. In an embodiment the barrier liner 414 is a tantalum or a tantalum alloy. Other metals may be used such as titanium. Other metals may be used such as vanadium. In an embodiment the barrier liner 414 is a ruthenium or a ruthenium alloy. Other metals may be used such as osmium. In an embodiment the barrier liner 414 is cobalt or a cobalt alloy. Other metals may be used such as rhodium. Other metals may be used such as iridium.

In an embodiment, the barrier liner 414 is formed by PVD, followed by the barrier precursor 416 is formed by PVD. In an embodiment, the barrier precursor 416 is sputtered from an aluminum-copper target and the barrier precursor 416 forms an $Al_xCu_y$ alloy. The $Al_xCu_y$ alloy may be formulated in connection with a useful barrier liner. In an embodiment, the barrier liner 414 is any of the above given barrier liners and the barrier precursor 416 is $Al_xCu_y$ alloy. In an embodiment, the $Al_xCu_y$ alloy is formulated to make a useful barrier precursor for an SSA barrier.

In an embodiment, the barrier liner 414 is formed by PVD, the barrier precursor 416 is sputtered from a manganese-copper target, and the barrier precursor 416 forms a $Mn_xCu_y$ alloy. The $Mn_xCu_y$ alloy may be formulated in connection with a useful barrier liner. In an embodiment, the barrier liner 414 is any of the above given barrier liners and the barrier precursor 416 is $Mn_xCu_y$ alloy. In an embodiment, the $Mn_xCu_y$ alloy is formulated to make a useful barrier precursor for an SSA barrier.

In an embodiment, the barrier liner 414 is formed by PVD and the barrier precursor 416 is sputtered from a titanium-copper target and the barrier precursor 416 forms a $Ti_xCu_y$ alloy. The $Ti_xCu_y$ alloy may be formulated in connection with a useful barrier liner. In an embodiment, the barrier liner 414 is any of the above given barrier liners and the barrier precursor 416 is $Ti_xCu_y$ alloy. In an embodiment, the $Ti_xCu_y$ alloy is formulated to make a useful barrier precursor for an SSA barrier.

In an embodiment, the barrier liner 414 is formed by PVD and the barrier precursor 416 is sputtered from a calcium-copper target and the barrier precursor 416 forms a $Ca_xCu_y$ alloy. The $Ca_xCu_y$ alloy may be formulated in connection with a useful barrier liner. In an embodiment, the barrier liner 414 is any of the above given barrier liners and the barrier precursor 416 is $Ca_xCu_y$ alloy. In an embodiment, the $Ca_xCu_y$ alloy is formulated to make a useful barrier precursor for an SSA barrier.

In an embodiment, the barrier liner 414 is formed by PVD and the barrier precursor 416 is sputtered from a zirconium-copper target and the barrier precursor 416 forms a $Zr_xCu_y$ alloy. The $Zr_xCu_y$ alloy may be formulated in connection with a useful barrier liner. In an embodiment, the barrier liner 414 is any of the above given barrier liners and the barrier precursor 416 is $Zr_xCu_y$ alloy. In an embodiment, the $Zr_xCu_y$ alloy is formulated to make a useful barrier precursor for an SSA barrier.

After filling the wire 418 into the recesses that contain the barrier liner 414 and the barrier precursor 416, a top surface 420 may be formed such as by planarizing.

FIG. 4b is a cross-section elevation of the back-end metallization depicted in FIG. 4a after further processing according to an embodiment. The back-end metallization 401 has been processed by formation of a composite dielectric layer 422 upon the top surface 420 (FIG. 4a). In an embodiment, the composite dielectric layer 422 includes a first film 424 that is substantially the same chemistry as the low-k ILD 412. Following formation of the first film 424, a second film 426 is formed that is denser than the first film 424. In an embodiment, the second film 426 is denser than the first film 424 by a factor in a range from 1.01 to 2 In an embodiment, where the first film 424 has a thickness in a range from 12-18 nm, the second film 426 has a thickness in a range from 4-8 nm.

After forming the second film 426, a subsequent film 428 is formed above the denser second film 426. In an embodiment, the subsequent film 428 is the same material as the first film 424. Formation of each film in the composite dielectric 422 may be done by spinning on a material and curing.

FIG. 4c is a cross-section elevation of the back-end metallization depicted in FIG. 4b after further processing according to an embodiment. The back-end metallization 402 has been processed by thermal treatment that converts the barrier precursor 416 (see FIG. 4b) into an SSA barrier 417 that is supported on three of four surfaces by the barrier liner 414. Thermal processing may be carried out by heating the apparatus 402 in a non-reactive atmosphere at a temperature range from 300° C. to 400° C. for a time period from 1 to 60 min As illustrated, the self-forming, self-aligned barrier 417 has grown from a U- or cup-shaped barrier precursor 416 (FIG. 4b) to become an enclosed barrier 417 and thereby an insulated wire 418 is insulated in the Z-direction. The top barrier 417 has grown onto the top surface 420 but only adjacent the wire 418. The top barrier 417 has not grown significantly upon the low-k ILD 412 at the top surface 420. It is observed that the alloying element(s) in the barrier precursor 416 have been taken up by—and reacted with at least silicon and oxygen components in the high-k ILD materials 412 and 424. Although no specific theory of formation is propounded, migration of the alloying element in the barrier precursor 416 is facilitated by presence of the barrier liner 414 and sufficient amounts of the alloying element has formed the top barrier 417 by a silicide process that uses at least silicon and oxygen in the ILD material 424. Planar migration of alloying elements may occur by alloy-element disassociation out of the barrier precursor 416 where these alloy elements are in abundance to allow formation of the top barrier 417. Planar migration of the alloy elements proceeds in the Z-direction along the wire 418 from the barrier precursor 416. Planar migration also proceeds in the X-direction (and the Y-direction which is into and out of the plane of the FIG.) along the wire 418 such that the top barrier 417 has been formed. It is observed that the top barrier 417 is a silicate that is richer in the alloy elements of the copper-alloy barrier precursor 416 and leaner in copper than the barrier precursor 416 before thermal processing.

FIG. 1d is a cross-section elevation of a back-end metallization depicted in FIG. 1c after further processing according to an embodiment. The back-end metallization 403 is seen in larger context such as has been processed by thermal treatment that converts the barrier precursor 416 (see FIG. 4b) into an SSA barrier 417. An additional metallization has been formed over the back-end metallization 418. In an embodiment, the metallization layers may range from M1 to M12 for example. Where the wire 418 is an $n^{th}$ metallization, the next metallization may be referred to as a subsequent wire $n+1^{st}$ metallization 448. During processing, a via 434 is formed through the composite dielectric layer 422. An $n+1^{st}$ self-forming, self-aligned enclosed barrier 447 has also been formed in preparation for laying down the subsequent wire 448. Formation of the $n+1^{st}$ self-forming, self-aligned barrier 447 may also be done similarly to formation of the $n^{th}$ self-forming, self-aligned barrier 417. It may now be appreciated that several metallization layers may be formed in this manner such that for example an M1-M12 metallization is achieved. In at least one of the metallization layers, an SSA barrier is formed according to an embodiment.

It may now also be appreciated that thermal budgets can be taken into consideration such that an entire metallization such as up to M12 is formed, but thermal processing is carried out only after all the metallizations have been installed. In this embodiment, the self-forming, self-aligned barriers of the several metallization layers are all formed simultaneously.

In an embodiment such as with multiple metallization layers being formed, a fraction of the metallization layers is formed followed by a first thermal processing. For example six metallization layers are formed (M1-M6) and first thermally processed, followed by six more metallizations (M7-M12) formed subsequently thermally processed.

In an embodiment, the thermal budget is spent by thermally processing each metallization layer seriatim such that each self-forming, self-aligned barrier has been fully formed and alloy element migration is stopped. In an embodiment, the thermal budget is spent by thermally processing each metallization layer seriatim but each self-forming, self-aligned barrier is not fully thermally processed when it is the most recent self-forming, self-aligned barrier to be formed. In this way, the first self-forming, self-aligned barrier is fully thermally processed during thermal processing of a subsequent self-forming, self-aligned barrier.

FIG. 5a is a cross-section elevation of a back-end metallization 500 during processing according to an example embodiment. Structures depicted include a semi conductive substrate 510 and a low-k ILD 512. Also, a barrier precursor 516 is formed as a slug in the bottom of a recess and a wire 518 is filled and polished back to expose a top surface 520.

FIG. 5c is a cross-section elevation of a back-end metallization depicted in FIG. 5a after further processing according to an embodiment. The structure 502 has been thermally processed such that an SSA barrier 517 has enclosed the wire 418 and thereby achieves an insulated wire 518. The self-forming, self-aligned barrier 517 has been converted from the barrier precursor 516 (FIG. 5a) and sufficient migration has occurred to achieve a silicate enclosure 517. Migration of alloy elements from the barrier precursor also is seen in a composite dielectric layer 522 that includes individual layers 524, 526, and 528 that are similar to the layers 124, 126, and 128 according to an embodiment. Further processing may be done that is similar to the processing depicted and described in FIGS. 1c and 1d.

FIG. 6a is a cross-section elevation of a back-end metallization 600 during processing according to an example embodiment. Structures depicted include a semi conductive substrate 610 and a low-k ILD 612. Also, a barrier liner 614 is formed and barrier precursor 616 is formed as a slug in the bottom of a recess that is lined with the barrier liner 614. A wire 618 is filled into the recess and polished back to expose a top surface 620. The barrier liner 614 may be any of the barrier liner embodiments set forth in this disclosure such as the barrier line 414 depicted in FIG. 4a.

FIG. 6c is a cross-section elevation of a back-end metallization depicted in FIG. 6a after further processing according to an embodiment. The structure 602 has been thermally processed such that an SSA barrier 617 has enclosed the wire 618 by forming a top barrier 617 and thereby an insulated wire 618 is insulated in the Z-direction. The self-forming, self-aligned barrier 617 has been converted from the barrier precursor slug 616 (FIG. 6a) and sufficient migration has occurred to achieve a silicate top barrier 617. Migration of alloy elements from the barrier precursor slug 616 also is seen in a composite dielectric layer 622 that includes individual layers 624, 626, and 628 that are similar to the layers 124, 126, and 128 according to an embodiment. Further processing may be done that is similar to the processing depicted and described in FIGS. 4c and 4d.

Figure 7:
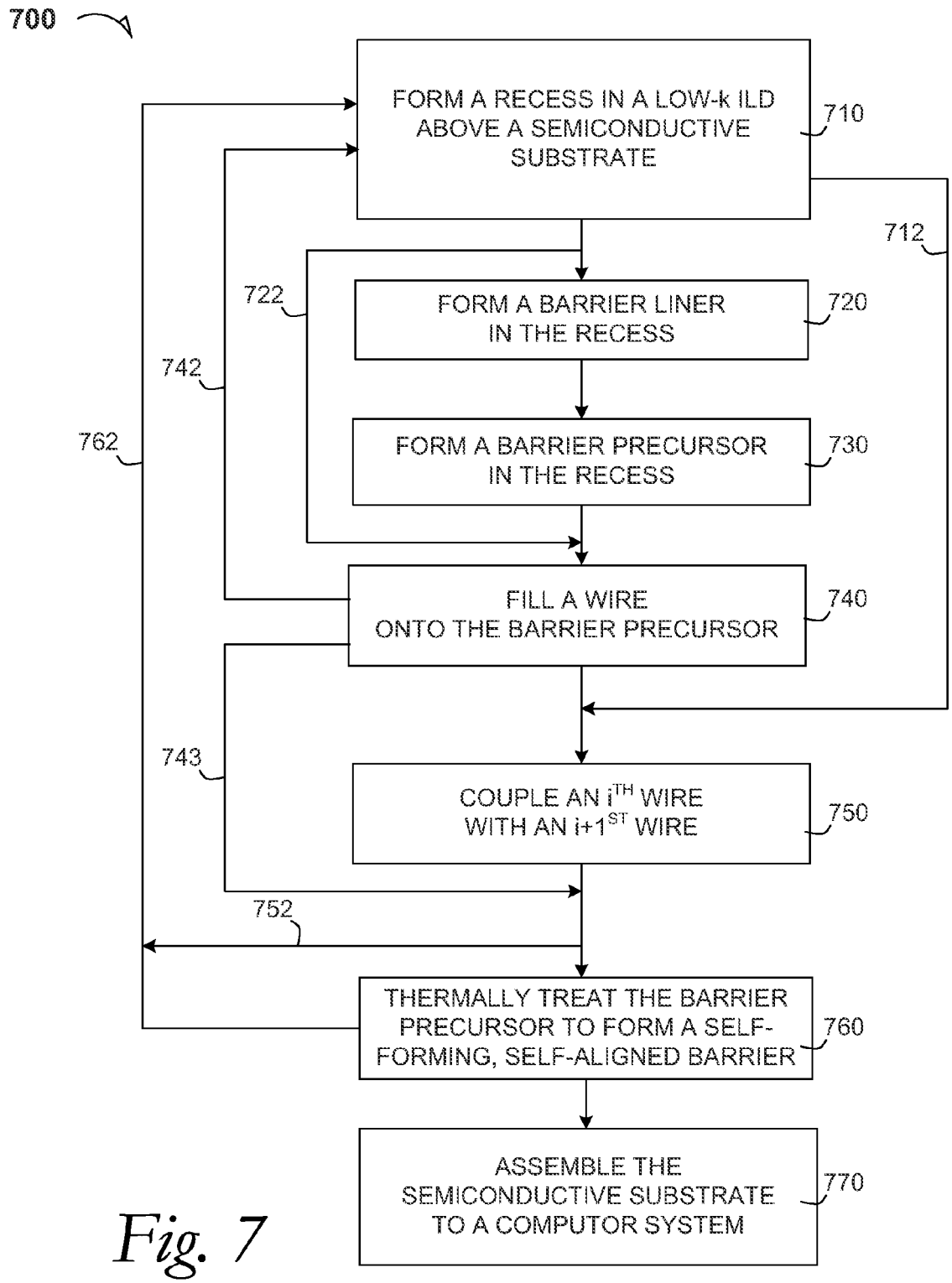
FIG. 7 is a process and method flow diagram according to an example embodiment.

FIG. 7 is a process and method flow diagram 700 according to an example embodiment.

At 710, the process includes forming a recess in a low-k ILD above a semi conductive substrate. By way of non-limiting example, the recess that holds the barrier precursor 116 and the wire 118 is formed above a semi conductive substrate 112 as illustrated in FIG. 1a. In a non-limiting example embodiment, the recess that holds the wire 318 is formed in the low-k ILD 312. The low-k ILD 312 is above a semi conductive substrate 310 as well as above at least one other wire 308.

At 720, the process includes forming a barrier liner in the recess. In a non-limiting example embodiment, the barrier liner 414 is first formed in the recess that also holds the barrier precursor 416 and the wire 418.

At 722, the process may skip the process 730 where no barrier liner is installed.

At 730, the process includes forming a barrier precursor in the recess. It may be seen that the process at 730 may be reached without using the process at 720. In a non-limiting example embodiment, the barrier precursor 116 is formed as seen in FIG. 1a. In a non-limiting example embodiment, the barrier precursor 416 is formed upon the barrier liner 414 in the recess as seen in FIG. 4a. In a non-limiting example embodiment, the barrier precursor 516 is formed as a slug in the recess as seen in FIG. 5a. In a non-limiting example embodiment, the barrier precursor 616 is formed as a slug 616 upon the barrier liner 614 in the recess as seen in FIG. 6a.

At 740, the process includes filling a wire onto the barrier precursor in the recess. In a non-limiting example embodiment, the wire 118 is filled onto the barrier precursor 116 as depicted in FIG. 1a. It may now be see that forming multiple metallizations such as an M1 to an M12 may be done by repeating processing as described and illustrated in several embodiments.

At 742, the process may be directed back to 710 for the formation of an $i+1^{st}$ wire where the current wire is the $i^{th}$ wire.

At 743, the process may proceed without coupling two wires such as proceeding directly to thermal treatment after filling a wire onto a barrier precursor.

At 750, the process includes coupling two wires such as an $i^{th}$ wire with an $i+1^{st}$ wire. In a non-limiting example embodiment, the first wire 118 is coupled to the subsequent wire 148 through the first via 134. The first wire in this embodiment is the $i^{th}$ wire 118, a via recess is formed in a dual-damascene process to form an $i^{th}$ via 134, followed by a subsequent-wire recess is formed into which the subsequent wire 148 ($i+1^{st}$ wire 148) is filled.

At 752, any of the preceding processes may be repeated in order to form subsequent metallizations before thermally treating the barrier precursor. It may now be understood that incidental processing may also advance formation of individual self-forming, self-aligned barriers such as thermal curing of any ILD layers. In a non-limiting example embodiment, all wires in a useful metallization are formed followed by a single thermal treatment that is of sufficient conditions to achieve self-forming, self-aligned barriers on all—or selected wires in the metallization.

At 760, the process includes thermally treating the barrier precursor under conditions to form an SSA barrier. In a non-limiting example embodiment, thermal processing is carried out by heating the apparatus 102 as seen in FIG. 1c in a non-reactive atmosphere at a temperature range from 200° C. to 300° C. for a time period from 30 sec to 60 min. It may now be understood that the process at 762 may be repeated for each individual metallization where this processing method is useful. It may now be understood that the process at 762 may be repeated for groups of metallizations less than the total of n metallizations where this processing method is useful. It may now be understood that the process at 762 may be skipped and all n metallizations are thermally processed just once near the end of processing where this processing method is useful.

At 770, a method embodiment includes assembling the semi conductive substrate to a computer system after completing the metallization(s).

FIG. 8 is a schematic of a computer system according to an embodiment.

The computer system 800 (also referred to as the electronic system 800) as depicted can embody a metallization of at least one self-forming, self-aligned barriers according to any of the several disclosed embodiments and their equivalents as set forth in this disclosure. A semiconductor substrate that bears self-forming, self-aligned barriers in the metallization is assembled to a computer system. The computer system 800 may be a mobile device such as a netbook computer. The computer system 800 may be a mobile device such as a wireless smart phone. The computer system 800 may be a desktop computer. The computer system 600 may be a handheld reader. The computer system 600 may be integral to an automobile. The computer system 800 may be integral to a television.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type of semi conductive substrate that is metallized with a self-formed, self-aligned barrier embodiment. As used herein, the processor 812 may mean any type of circuit such as, but not limited to, a microprocessor, a microcontroller, a graphics processor, a digital signal processor, or another processor. In an embodiment, the processor 812 is the embedded die disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems. In an embodiment, the processor 810 includes on-die memory 816 such as static random-access memory (SRAM). In an embodiment, the processor 810 includes embedded on-die memory 816 such as embedded dynamic random-access memory (eDRAM).

In an embodiment, the integrated circuit 810 is complemented with a subsequent integrated circuit 811 such as a graphics processor or a radio-frequency integrated circuit or both as set forth in this disclosure. In an embodiment, the dual integrated circuit 810 includes embedded on-die memory 817 such as eDRAM. The dual integrated circuit 811 includes an RFIC dual processor 813 and a dual communications circuit 815 and dual on-die memory 817 such as SRAM. In an embodiment, the dual communications circuit 815 is particularly configured for RF processing.

In an embodiment, at least one passive device 880 is coupled to the subsequent integrated circuit 811 such that the integrated circuit 811 and the at least one passive device are part of the any hybrid SoC device that includes the integrated circuit 810 and the integrated circuit 811 capabilities with partitioned front-end passive devices 880 such as supported by the package substrate.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as a hybrid SoC device that is metallized with at least one self-formed, self-aligned barrier according to an embodiment.

In an embodiment, the electronic system 800 also includes a display device 850, and an audio output 860. In an embodiment, the electronic system 800 includes an input device such as a controller 870 that may be a keyboard, mouse, touch pad, keypad, trackball, game controller, microphone, voice-recognition device, or any other input device that inputs information into the electronic system 800. In an embodiment, an input device 870 includes a camera. In an embodiment, an input device 870 includes a digital sound recorder. In an embodiment, an input device 870 includes a camera and a digital sound recorder.

A foundation substrate 890 may be part of the computing system 800. In an embodiment, the foundation substrate 890 is a motherboard that supports an SSA barrier that contacts metallization wire embodiments. In an embodiment, the foundation substrate 890 is a board which supports an integral dielectric barrier contacted metallization wire embodiment is mounted. In an embodiment, the foundation substrate 890 incorporates at least one of the functionalities encompassed within the dashed line 890 and is a substrate such as the user shell of a wireless communicator.

As shown herein, the integrated circuit 810 can be implemented in a number of different embodiments, including a semi conductive substrate that is metallized with at least one self-formed, self-aligned barrier according to any of the several disclosed embodiments and their equivalents, an electronic system, a computer system, one or more methods of fabricating a integrated circuit, and one or more methods of fabricating an SSA barrier that includes a semi conductive substrate that is metallized with at least one self-formed, self-aligned barrier according to any of the several disclosed embodiments as set forth herein in the various embodiments and their art-recognized equivalents. The elements, materials, geometries, dimensions, and sequence of operations can all be varied to suit particular I/O coupling requirements including a semi conductive substrate that is metallized with at least one self-formed, self-aligned barrier embodiments and their equivalents.

Although a die may refer to a processor chip, an RF chip, an RFIC chip, IPD chip, or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus, comprising:
a semi-conductive substrate;
a metallization wire including a bottom, a top opposite the bottom, and two sides, wherein the metallization wire is disposed in an interlayer dielectric layer (ILD) that is disposed on the semi-conductive substrate, and wherein the metallization wire is contacted with and enclosed in an integral dielectric barrier composed of a silicide that encloses the bottom, the top and the two sides of the metallization wire, the silicide being in contact with the metallization wire; and
a dielectric film that is substantially the same chemistry as the ILD disposed on the ILD, the dielectric film being in contact with the ILD and the silicide, the dielectric film being disposed directly over the metallization wire.

2. The apparatus of claim 1, wherein the metallization wire is copper and wherein the silicide of the integral dielectric barrier has a copper-lean composition adjacent the ILD and a copper-rich composition adjacent the wire.

3. The apparatus of claim 1, wherein the metallization wire is a metallization first wire, the apparatus further including:
a metallization second wire adjacent the metallization first wire, wherein the metallization second wire is coupled to the metallization first wire through a via.

4. The apparatus of claim 1, wherein the metallization wire is a metallization first wire, the apparatus further including:
a metallization second wire adjacent the metallization first wire, wherein the metallization second wire is in contact with a first via that is in contact with the metallization first wire.

5. The apparatus of claim 1, wherein the metallization wire is a metallization first wire, the apparatus further including:
a metallization second wire adjacent the metallization first wire, wherein the metallization second wire is in contact with a first via that is in contact with the metallization first wire; and
a metallization subsequent wire, wherein the metallization second wire is between the metallization first wire and the metallization subsequent wire.

6. The apparatus of claim 1, wherein the metallization wire is a metallization first wire, and wherein the integral dielectric barrier is an integral dielectric first barrier, the apparatus further including:
a metallization second wire adjacent the metallization first wire, wherein the metallization second wire is coupled to the metallization first wire through a via, and wherein the metallization second wire is enclosed in an integral dielectric second barrier.

7. The apparatus of claim 1, wherein the metallization wire is a metallization first wire, and wherein the integral dielectric barrier is an integral dielectric first barrier, the apparatus further including:
a metallization second wire adjacent the metallization first wire, wherein the metallization second wire is coupled to the metallization first wire through a via, and wherein the metallization second wire is enclosed in an integral dielectric second barrier; and
a metallization subsequent wire, wherein the metallization second wire is between the metallization first wire and the metallization subsequent wire, and wherein the metallization subsequent wire is enclosed in an integral dielectric subsequent barrier.

8. The apparatus of claim 1, wherein the metallization wire is a metallization first wire, and wherein the integral dielectric barrier is an integral dielectric first barrier, the apparatus further including:
a metallization second wire adjacent the metallization first wire, wherein the metallization second wire is coupled to the metallization first wire through a via, and wherein the metallization second wire is enclosed in an integral dielectric second barrier.

9. The apparatus of claim 1, wherein the silicide of the integral dielectric barrier is formed by thermal treatment of a barrier precursor composed of at least one of aluminum-copper alloy ($Al_xCu_y$), manganese-copper alloy ($Mn_xCu_y$), titanium-copper alloy ($Ti_xCu_y$), calcium-copper alloy ($Ca_xCu_y$), zirconium-copper alloy ($Zr_xCu_y$), and aluminum-titanium-copper alloy ($Al_xTi_yCu_z$), where x, y and z represent relative amounts.

10. The apparatus of claim 1, wherein no barrier liner other than the silicide of integral dielectric barrier is disposed between the metallization wire and the ILD.

11. An apparatus, comprising:
a semi-conductive substrate;
an interlayer dielectric layer (ILD) disposed on the semi-conductive substrate;
a metallization wire disposed in the ILD, wherein the metallization wire includes a bottom, a top opposite the bottom, and two sides, and wherein the metallization wire is contacted with an integral dielectric barrier composed of silicide at the top of the metallization wire, the silicide being in contact with the metallization wire;
a dielectric film that is substantially the same chemistry as the ILD disposed on the ILD, the dielectric film being in contact with the ILD and the silicide, the dielectric film being disposed directly over the metallization wire; and
a metallic barrier liner that contacts the metallization wire at the bottom of the metallization wire and the sides of the metallization wire, and wherein the metallic barrier liner is a different metal than the metallization wire.

12. The apparatus of claim 11, wherein the metallic barrier liner is selected from the group consisting of a refractory metal, tantalum, a tantalum alloy, titanium, a titanium alloy, vanadium, a vanadium alloy, ruthenium, a ruthenium alloy, osmium, an osmium alloy, cobalt, a cobalt alloy, rhodium, an rhodium alloy, iridium, and an iridium alloy.

13. The apparatus of claim 11, wherein the metallization wire is copper, wherein the silicide of the integral dielectric barrier has a copper-lean composition adjacent the ILD and a copper-rich composition adjacent the wire, and wherein the barrier liner is selected from the group consisting of a refractory metal, tantalum, a tantalum alloy, titanium, a titanium alloy, vanadium, a vanadium alloy, ruthenium, a ruthenium alloy, osmium, an osmium alloy, cobalt, a cobalt alloy, rhodium, an rhodium alloy, iridium, and an iridium alloy.

14. The apparatus of claim 11, wherein the metallization wire is a metallization first wire, the apparatus further including:
   a metallization second wire adjacent the metallization first wire, wherein the metallization second wire is coupled to the metallization first wire through a via.

15. The apparatus of claim 11, wherein the metallization wire is a metallization first wire, the apparatus further including:
   a metallization second wire adjacent the metallization first wire, wherein the metallization second wire is in contact with a first via that is in contact with the metallization first wire.

16. The apparatus of claim 11, wherein the metallization wire is a metallization first wire, the apparatus further including:
   a metallization second wire adjacent the metallization first wire, wherein the metallization second wire is in contact with a first via that is in contact with the metallization first wire; and
   a metallization subsequent wire, wherein the metallization second wire is between the metallization first wire and the metallization subsequent wire, wherein the metallization subsequent wire is contacted with a metallic barrier liner upon a bottom and two sides, and wherein the metallization subsequent wire is contacted with a subsequent integral dielectric barrier at the subsequent wire top.

17. The apparatus of claim 11, wherein the dielectric film is a first film of a composite dielectric layer disposed on the ILD, the composite dielectric layer further comprising:
   a second film disposed on the first film, the second film being denser than the first film; and
   a subsequent film formed on the second film, the subsequent film being composed of a same material as the first film, wherein the first film includes silicon (Si) and oxygen (O).

* * * * *